US009448254B2

(12) United States Patent
Samreth

(10) Patent No.: US 9,448,254 B2
(45) Date of Patent: Sep. 20, 2016

(54) TOUCH CONTROLLED ESD TESTER

(75) Inventor: Sovann Samreth, San Bernardino, CA (US)

(73) Assignee: Botron Co. Inc., Phoenix, AZ (US)

( * ) Notice: Subject to any disclaimer, the term of this patent is extended or adjusted under 35 U.S.C. 154(b) by 804 days.

(21) Appl. No.: 13/458,060

(22) Filed: Apr. 27, 2012

(65) Prior Publication Data
US 2013/0289901 A1 Oct. 31, 2013

(51) Int. Cl.
G08B 21/00 (2006.01)
G01R 1/02 (2006.01)
G01R 31/02 (2006.01)

(52) U.S. Cl.
CPC .............. *G01R 1/025* (2013.01); *G08B 21/00* (2013.01); *G01R 31/026* (2013.01)

(58) Field of Classification Search
CPC ........................... G01R 31/026; G01R 31/025
See application file for complete search history.

(56) References Cited

U.S. PATENT DOCUMENTS

| 4,638,399 A * | 1/1987 | Maroney et al. ............ 361/220 |
| 5,051,732 A | 9/1991 | Robitaille |
| 6,052,053 A * | 4/2000 | Jubin et al. ................... 340/540 |
| 6,078,875 A * | 6/2000 | Jubin .................. G01R 31/001 324/500 |
| 6,892,150 B2 * | 5/2005 | Pickerd et al. ................. 702/67 |
| 6,930,612 B1 * | 8/2005 | Kraz et al. ..................... 340/649 |
| 2003/0000734 A1 * | 1/2003 | Nakagawa .................... 174/250 |
| 2003/0107379 A1 * | 6/2003 | Weil .............................. 324/458 |
| 2003/0234651 A1 * | 12/2003 | Nguyen ........................ 324/500 |
| 2010/0019914 A1 * | 1/2010 | Lin .......................... A61N 1/08 340/649 |
| 2010/0241868 A1 * | 9/2010 | Nachef et al. ................ 713/186 |
| 2013/0226476 A1 | 8/2013 | Samreth |

* cited by examiner

Primary Examiner — Paul D Lee
Assistant Examiner — Mark Crohn
(74) Attorney, Agent, or Firm — Robert J. Rapp

(57) ABSTRACT

The invention is an apparatus and a process, the apparatus of the invention is an intelligent system configured to test the efficacy of electrostatic discharge devices that includes a touch screen display, a microcomputer, and resident persistent non-volatile memory. Preferred embodiments use the persistent resident memory to store a plurality of test data from a plurality of tests correlated as a data base. The apparatus of the invention in certain embodiments operates as a WEB host wherein remote users may view ESD test data in various ways. The process of the invention relates to the configuration of the apparatus of the invention to at least display test data from a plurality of electrostatic dissipation device tests. The process of the invention may also include the configuration of test settings, or email notification metrics.

19 Claims, 5 Drawing Sheets ated or assembled into assemblies are prime examples where static can easily damage the electronics if the buildup of excessive charge is not managed.

TOUCH CONTROLLED ESD TESTER

BACKGROUND OF THE INVENTION

Electrostatic voltages are known to provide a threat to electronic components. Electronic components can be damaged when a charge stored on a person, on a piece of equipment, or on a surface rapidly dissipates or discharges through an electronic component or assembly.

An accumulation of extra electrons occurs naturally when two predominantly insulated surfaces are rubbed together. For example rubbing ones feet across the carpet can easily cause a voltage of thousands of volts to accumulate on a person. In this instance the person is insulated from a ground or from a conductive surface by the carpet, as the person rubs their feet they accumulate extra electrons. Since each electron has a charge typically measured in Coulombs (C) the more electrons accumulated on the person, the higher the charge a person carries. The person is storing charge just like a capacitor stores charge, by accumulating electrons. Such accumulated charge is referred to as a static charge because it is not moving relative to the person or surface on which the charge is accumulated.

If a person is significantly charged and touches a door knob a spark frequently jumps between the person and the door knob. This event discharges some or all of the accumulated charge on the individual and into the door knob through an electrostatic discharge event.

The charge carried by a single electron is e, and $e=-1.602\times10^{-19}$ C (Coulombs). The number of Coulombs (C) stored on a capacitor, typically measured in Farads (F) determines the voltage (V) stored on the capacitor such that 1C/1F=1V. By this formula one Coulomb stored on a 1 Farad capacitor has a voltage of 1 volt.

This formula shows that increasing the number of electrons stored on a surface increases the charge stored on the surface while increasing the voltage. The voltage increases proportionally to the capacitance (the number of Farads) of the surface, where the charge is proportional to the number of electrons stored on or in the surface. Voltages stored statically in such a way are commonly referred to as electrostatic voltages.

Individuals can easily store thousands of volts on their body. If discharged rapidly into an electronic component or assembly the electronic component or assembly may be damaged or destroyed. Some components can be damaged with as little as 50 volts of potential across critical junctions. Similarly static charge can accumulate on pieces of equipment or on surfaces when two surfaces are rubbed together.

Such accumulated charges stored on individuals, equipment, or on surfaces presents a threat to the viability of electronic components and assemblies especially when those components are not in a protective case. Manufacturing environments where electronic components are fabricated or assembled into assemblies are prime examples where static can easily damage the electronics if the buildup of excessive charge is not managed.

Various pieces of equipment designed to mitigate threats from electrostatic voltages such equipment includes wrist straps, foot straps, mats, de-ionizers, and electrostatic dissipation device testers.

Wrist straps, foot straps, and mats are examples of electrostatic discharge devices. Such devices have a resistance optimized to conduct electricity slowly. If the resistance is too low, the device will conduct electricity rapidly, if the resistance is too high, the device will not dissipate a static charge efficiently.

Controlling the series resistance of a person in contact with one or more electrostatic dissipation devices is critical to controlling electrostatic charge accumulation in an electronic manufacturing environment. Typically an operator will wear or be in contact with one or more electrostatic dissipation devices when they are working. Wrist straps and foot straps are typically worn by an individual. Electrostatic dissipative mats are frequently placed on tables in work areas to keep static charge from accumulating on the tables or work areas.

Electrostatic discharge devices prevent charge from accumulating on surfaces or on persons in contact with them by conducting charge to ground. Electrostatic discharge devices also prevent the rapid discharge of accumulated charge when a highly charged object or person contacts them initially by conducting charge to ground slowly.

Measuring the series resistance of a person in contact with an electrostatic discharge device is therefore important to mitigating both charge accumulation and rapid discharge of accumulated charge. In this document the term operator resistance or resistance of the operator is the series resistance of a person in contact with an electrostatic discharge device. Optimally the operator resistance should be between 600 thousand ohms and 3 million ohms.

Electrostatic dissipation device testers typically determine the operator resistance by first applying a known voltage across a known resistance in that is connected in series with the operator resistance. The voltage drop across the operator resistance is then measured and ohms law is used to calculate the resistance of the operator.

Conventional testers capable of testing operator resistance do so by using two analog comparators. The analog comparators compare the voltage drop across the operator resistance to a voltage set by a voltage divider network. Typically one analog comparator is configured to activate when the operator resistance is too low, and the second analog comparator is configured to activate when the operator resistance is too high. Such testers test are limited to reporting pass, fail low (resistance too low) and fail high (resistance too high).

Limitations of testers sold in this market place also include crude displays. For example when performing tests, some testers flash red and green status LEDs simultaneously, and then illuminate a green LED or a red LED indicating that a test has passed or failed respectively. Such displays can confuse operators or cause operators to have questions about the efficacy of the tester.

Conventional ESD testers are also not intelligent, they do not maintain a persistent record of previous tests instead they are limited to sending data to other devices that maintain a data base, and they rely on the use of mechanical buttons or switches to initiate tests.

Conventional ESD testers also cannot be configured by manipulating the tester itself.

SUMMARY OF THE INVENTION

The invention is an apparatus and a process, the apparatus of the invention is an intelligent system configured to test the efficacy of electrostatic discharge devices that includes a touch screen display, a microcomputer, and resident persistent memory. Preferred embodiments use the persistent resident memory to store a plurality of test data from a plurality of tests correlated as a data base. The persistent memory may be any memory that is non-volatile including yet not limited to disk drives, flash drives, flash memory, memresistor memory, phase change memory, or other form of memory capable of retaining digital information when powered off. The process of the invention relates to the configuration of the apparatus of the invention to at least display test data from a plurality of electrostatic dissipation device tests. The process of the invention may also include the configuration of test settings, or email notification metrics.

Typically a person will approach the apparatus and interact with it by using the touch screen similar to ways that touch screens are used on cell phones or tablet computers. Operations performed by a person may include yet are not limited to authenticating themselves as a valid operator, testing the efficacy of their ESD devices, viewing test histories, or configuring the apparatus.

As described in the Detailed Description of the Invention section of this disclosure, tests may be initiated by a person touching a touch sensitive spot that will be referred to as a virtual test button in this disclosure. In some embodiments the virtual test button is located on the apparatus and is not part of the touch screen display.

In certain other embodiments an individual or a supervisor could view historical test data stored in the persistent resident memory. For example the supervisor could view the last 10 tests of a first operator, the data base may be configured to include actual resistance measurement, or simply record that the operator passed or failed specific tests. The persistent memory, micro-computer, and control software form a data base that contains ESD test data from a plurality of tests. Since the invention has a self-contained data base, no external data base as it is capable of operating and saving test data is required.

Alternatively the test status of a particular electrostatic discharge device may be reviewed by entering a reference number on the touch screen display. The invention is not limited to recording the test status and information correlated to particular individuals, data in the data base may be formatted, organized, or displayed showing information that an authorized user wishes to review.

In certain embodiments an operator may enter a test identifier that indicates the type or class of testing that the operator desires. For example a test identifier of 1 may indicate that only a wrist-strap needs to be tested, where a test identifier of 2 may indicate that both a wrist-strap and a foot-strap must be tested.

The apparatus may also be configured to send out email to one or more individuals when certain events occur. For example an email may be sent to a supervisor when a test fails.

Yet other embodiments of the invention also incorporate security features: biometric finger or face recognition used to identify an individual.

The apparatus of the invention for testing the efficacy of electro static discharge devices that includes a database of previous tests contained in a non-volatile memory, at least one touch sensitive screen, and that may include a non-mechanical touch sensitive virtual test button. The apparatus does not require the use of mechanical switches and will typically be operated using only touch sensitive non-mechanical screens or virtual test buttons. The apparatus also may be configured to send email to one or more individuals when certain events occur.

The process of the invention includes the act of configuring the apparatus of the invention to display electrostatic discharge device stored in its persistent non-volatile memory. The process of the invention may also include the configuration of test settings, email notification metrics, or the setting of programmable test voltages.

DETAILED DESCRIPTION OF THE INVENTION

The invention is an apparatus and a process, the apparatus of the invention is an intelligent system configured to test the efficacy of electrostatic discharge devices that includes a touch screen display, a microcomputer, and resident persistent memory. Preferred embodiments use the persistent resident memory to store a plurality of test data from a plurality of tests correlated as a data base. The persistent memory may be any memory that is non-volatile including yet not limited to disk drives, flash drives, flash memory, memresistor memory, phase change memory, or other form of memory capable of retaining digital information when powered off. The process of the invention relates to the configuration of the apparatus of the invention to at least display test data from a plurality of electrostatic dissipation device tests. The process of the invention may also include the configuration of test settings, email notification metrics, or the setting of programmable test voltages. Programmable test voltages enable the apparatus of the invention to be configured to operate with new highly sensitive electronic components that can be damaged by very low voltages, or be configured to operate using voltages in ranges that are commonly used in conventional electrostatic discharge device testers.

A simplified conceptual model of one embodiment of the apparatus is depicted in FIG. 1. Here an apparatus of the invention, intelligent micro-computer configured to test the efficacy of electrostatic discharge devices, item 1 has a plurality of inputs S1, S2, and SN are shown. Each input is connected with an analog to digital converter: input S1 is connected to analog to digital converter 1 ADC1, input S2 is connected to analog to digital converter 2 ADC2, and input SN is connected to analog to digital converter ADCN. A series of dots shown as Item SE depicts an extensible structure where any number of inputs may be incorporated into the invention. In FIG. 1 the analog to digital converters are contained within microcomputer CPU. Microcomputer CPU is in communication with a display buffer BUF, and data communication interface COM.

FIG. 1 also shows input S1 connected to item 2: input S1 is directly connected to electrostatic discharge device 1 ESD1, ESD1 is connected to an operator's wrist OP1, OP1 is also connected to common ground C. Furthermore common ground C connects to electrostatic device tester and data logging unit item 1 forming a closed electrical circuit. Item 2 is the operator resistance of an operator in series with electrostatic discharge device 1 ESD1; it is the resistance of electrostatic discharge device 1 ESD1 and a person's wrist OP1 connected in series.

The resistance of item 2 (EDS1 in series with OP1) may be measured by item 1 using techniques standard in the art, including yet not limited to connecting a known voltage V1 to a known resistance R1, which in turn is connected in series to item 2. The resistance of item 2 may be determined by measuring the voltage on S1 and by calculating the resistance using ohms law. The resistance of item 2 is the combined resistance of operator 1 in series with electrostatic discharge device 1 ESD1.

Similarly analog to digital converter 2 ADC2 is connected to input S2 that is connected to electrostatic discharge device 2 ESD2, which in turn is connected to an operator's foot OP2, and the operator's foot OP2 is connected to common ground C. Item 3 includes electrostatic device 2 EDS2 connected in series to an operator's foot OP2. The resistance of item 3 may be determined by applying a known voltage V2 to resistor R2, by measuring the voltage at input S2 relative to common ground C and calculating the resistance of item 3 using ohms law.

Again a series of dots SE indicates an extensible structure. Also shown is analog to digital converter ADCN is connected to input SN which is connected to a virtual button VB.

As mentioned above each analog to digital converter in FIG. 1 are contained within microcomputer CPU. Here microcomputer CPU communicates to display buffer BUF using connection 4, and display buffer BUF communicates with a touch screen display TCHDISP using connection 5. Microcomputer CPU is thus configured to update the touch screen display TCHDISP and to receive commands from the touch screen display TCHDISP.

Microcomputer CPU is configured to receive and send messages to devices 8 external to item through communication port COM. Here microcomputer CPU sends and receives data from the communication port COM using communication bus 6. Communication port COM also sends and receives data from external devices 8 using data communication interface 7. Data communication interface 7 may be implemented in various ways that include yet are not limited to wired or wireless data communication interfaces and may be configured to send email. FIG. 1 also shows an Earth ground E connected to item 1. Earth ground E typically sourced from an alternating current wall outlet will typically be isolated from common ground C by some impedance. Microcomputer CPU also communicates with persistent non-volatile memory NVM using a memory data bus 9.

Embodiments of microcomputers include a digital signal processor, a microprocessor, an FPGA configured with microprocessor functions, or other compute engine known in the art.

The invention is not limited to the use of a plurality of analog to digital converters as shown in FIG. 1. Alternate embodiments of the invention may use as few as one analog to digital converter. Analog to digital converters may also be located externally to the microcomputer CPU.

FIG. 2 shows an embodiment of the invention 1 where an operator may test a plurality of electrostatic discharge devices connected to the operator. Electrostatic discharge devices in FIG. 2 are a Dual Wire Wrist Strap, a Single Wire Wrist Strap, a Left Foot Strap, and a Right Foot Strap each connected to a multiplexer MUX using inputs S1, S2, S3, and S4 respectively. Multiplexer MUX is controlled by microcomputer CPU using control bus MC, microcomputer CPU may select any input S1, S2, S3, or S4 to be switched to the multiplexor's MUX output connection MO. Multiplexor MUX output connection MO is connected to an amplifier AMP. Item AIN is the amplifier's AMP output connection, item AIN is also the input of an analog to digital converter ADC. Microcomputer CPU controls the analog to digital converter ADC using control bus ADCC. Item DIN is a digitized representation of an analog signal or value on the input of the analog to digital converter's ADC input AIN. Microcomputer CPU is thus able to observe any input S1, S2, S3, or S4 and may test a plurality of electrostatic discharge devices sequentially using a single analog to digital converter ADC.

FIG. 3 shows an apparatus capable of testing the efficacy of electrostatic discharge devices 10 that includes a touch screen display 11 and a virtual test button 12 shown as a circle with text "TEST" in the center of the circle. Virtual test buttons consistent with those used in the invention may contain any phrase, text, or image containing more than one electrically conductive surface located in close proximity to each other.

FIG. 4 shows a virtual test button 12 including letters TEST; the first letter item 13 is the letter T, the second letter item 14 is the letter E, the third letter item 15 is the letter S, and the fourth letter item 16 is the letter T (this is the second letter T reading left to right). The letters in the virtual test button 12 are electrically conductive. In some embodiments of the invention these letters are copper conductors electroplated with gold to resist oxidation; the invention is not limited to using gold plated electrically conductive letters.

FIG. 4 shows each letter connected to various parts in a schematic diagram. The letter E item 13 and the letter T item 15 are connected to a pull up resistor RP, and to an input IN on switch SW. Pull up resistor RP is connected to an input voltage VIN. Switch SW is also connected to ground GND (depicted as a triangle), to a control signal pin CNTL, and to second resistor RS. The second resistor RS connects an output OUT of switch SW pin ADC. Pin ADC will be connected to an Analog to Digital converter that is not depicted in FIG. 4.

When control signal CNTL goes active, switch SW will turn on and electrically connect switch SW input IN to switch SW output OUT.

The first letter T item 13 and letter S item 15 are connected to ground GND (depicted as another triangle).

A person touching any two adjacent letters on the virtual button 12 will cause the voltage on the input IN of the switch SW to change. When the person touches two adjacent letters a voltage divider network is created. For example when a person's fingertip touches the first letter T item 13 and letter E item 14 the resistance of the persons fingertip electrically connects these letters, the resistor divider network formed includes an input voltage VIN connected to one end of pull up resistor RP, a second end of pull up resistor RP is connected to letter E item 14, letter E item 14 connects to the first letter T through the resistance of a person's fingertip (not depicted).

When the person is not in contact with the letters, the voltage on input IN of switch SW is equal to input voltage VIN, because there is no voltage divider network when someone is not touching the virtual test button. When the person is in contact with the letters however, a voltage divider network is created causing current to flow and the voltage on the input IN of switch SW to reduce. When control signal CNTL goes active switch SW input IN is connected to output OUT and the change in voltage may be observed on second resistor RS and on pin ADC. The letters and attached circuits thus form a virtual button as there is no mechanical movement; instead a change in voltage indicates that someone has touched the virtual switch by creating a voltage divider network. When ADC is connected to an analog to digital converter that is in turn connected to a micro-computer, the micro-computer will be capable of detecting and responding to the virtual switch being touched just as if it were a mechanical switch.

Such a voltage divider network may be formed between any two different voltages: Even though FIG. 4 depicts a voltage divider network between an input voltage VIN and ground GND when someone touches two adjacent electrically conductive letters a voltage divider network would still be formed when any two different voltages are used. Thus the invention is not limited to a voltage divider network between and input voltage VIN and ground GND because a voltage divider network will be formed between a first input voltage and a second input voltage at a different voltage potential than the first input voltage potential.

FIG. 5 shows an embodiment of the apparatus of the invention 1 where the test voltage may be changed. FIG. 5 includes the same electrostatic discharge devices shown in FIG. 2 a Dual Wire Wrist Strap, a Single Wire Wrist Strap, a Left Foot Strap, and a Right Foot Strap each connected to inputs S1, S2, S3, and S4 respectively.

Inputs S1, S2, S3, and S4 here are connected to a multiplexer MUX and a de-multiplexer DEMUX. Microcomputer CPU controls which input S1, S2, S3, or S4 is electrically connected to item AIN; item AIN is the output of multiplexer MUX and is the input to analog to digital converter ADC.

Multiplexer MUX connects to an analog digital converter ADC using connection AIN. Microcomputer CPU controls analog to digital converter ADC control bus ADCC, and item DIN is a digital input bus to microcomputer CPU that is output from analog to digital converter ADC. Microcomputer CPU also controls a digital to analog converter DAC using control bus DACC and digital output DOUT.

Microcomputer CPU here is configured to program a test voltage PTV on the output of digital to analog converter DAC. One side of test reference resistor R1 is connected to the output of the digital to analog converter DAC, and the other side of test reference resistor R1 is connected the input of a de-multiplexor DEMUX using connection DMIN. Microcomputer CPU controls de-multiplexor DEMUX using de-multiplexor control bus DMC. Microcomputer CPU can configure de-multiplexor DEMUX to electrically connect DMIN to any one of the inputs S1, S2, S3, or S4.

Microcomputer CPU in FIG. 5 can thus set programmable test voltage PTV and make a voltage divider network that includes R1 (R1 has a known resistance) and any of the electrostatic discharge devices depicted in FIG. 5 and then determine the resistance of the electrostatic discharge devices by measuring the voltage on S1, S2, S3, or S4. For example to determine the resistance of the Single Wire Wrist Strap microcomputer CPU would program the programmable test voltage, configure the de-multiplexor DEMUX to connect to input S2, configure multiplexor MUX to connect to input S2, measure the voltage on input S2 using analog to digital converter ADC, and the calculate the resistance of the Single Wire Wrist Strap using ohms law.

Software controlling the apparatus of the invention is configured to display information to a person, and receive input from a touch screen display. A person, typically an operator or a supervisor with appropriate access privileges interacts with the apparatus of the invention in ways similar to how one uses a smart phone or tablet computer with a touch screen display. The invention is configured to test the efficacy of electrostatic discharge devices and to store data from a plurality of tests in a data base contained within the apparatus of the invention.

A person with appropriate access privileges, typically a supervisor may review data contained in the data base using the touch screen display. For example the supervisor may touch an icon on the display and the display would be updated to show information relating to previous tests performed by the apparatus of the invention. In some embodiments test histories relating to particular individuals may be viewed by interacting with the touch screen display. The supervisor could touch a portion of the display showing text "display operator test histories" and a list of operators would appear. Touching the name of an operator displayed on the screen would then cause that operator's ESD test history to be displayed on the display. Test history data may include date and time of a test, identify what tests were performed, identify what electrostatic discharge devices were tested, resistance values measured for each test, and/or pass fail status of each particular test.

In this disclosure a supervisor is a person with appropriate access privileges to view previous test histories, modify metrics for sending emails, or change the configuration of the apparatus of the invention. An operator in this disclosure is a person who manipulates the apparatus of the invention to test the efficacy of their own electrostatic discharge devices and may have privileges to view their own test history. In some embodiments of the invention supervisors can configure the apparatus of the invention to allow any person to view test data or change other configurations as the supervisor deems appropriate.

In some embodiments of the invention test history data may be viewed by date, time, the type of test, the type of electrostatic discharge test devices tested, or by other criteria that the invention is programmed or configured to display. The invention may also be configured to require a login, or biometric input identifying an individual before allowing that individual to view test history data. Once that individual is identified to have appropriate access privileges, the apparatus of the invention may be configured to display ESD test history data in format preferred by that individual.

In some other embodiments of the invention the apparatus will be configured to send email to one or more individuals when certain events occur. For example an email may be sent to a supervisor when an individual's electrostatic discharge device fails a test, when an individual's electrostatic discharge device's resistance has changed, when an operator attempts to test a wrist strap when they should be testing both a wrist strap and a foot strap, or when other events occur. Typically email will be sent using standard email transfer protocols including yet not limited to Simple Mail Transfer Protocol (SMTP).

The apparatus may also include the ability to operate as a WEB portal. In certain embodiments WEB portal functionality will be configured to operate using Hyper Text Markup Language (HTML). In some embodiments the data base itself may also be parsed, organized, sorted, and displayed as a WEB page even if not in communication with the Internet or on an intranet.

In yet other embodiments of the invention an operator of the apparatus thus could review test data in the database using a WEB browser running on a remote computer. The apparatus of the invention in such an embodiment would be configured to be a WEB host configured to share test data from its data base of electrostatic discharge devices with authorized individuals typically using HTML.

Yet other embodiments of the invention may include connectors capable of connecting additional displays to the apparatus. Such connectors include yet are not limited to standard VGA, or High Definition Multimedia Interface (HDMI) connectors.

The process of the invention begins with a supervisor configuring the apparatus of the invention to display test data recorded in the apparatus's persistent non-volatile memory according to metrics selected by the supervisor. Metrics selected by the supervisor for viewing data include yet are not limited to viewing test data by date, by time, by type of test, by type of electrostatic discharge device, by individual, by test voltage, or other metrics important to the supervisor. Metrics are thus set by a supervisor on the apparatus of the invention and the apparatus displays on the touch screen display electrostatic discharge device test data in the format configured by the supervisor.

The process of the invention may also include authenticating the access rights of an individual attempting to access supervisor level privileges. This authentication in some embodiments includes a login name and password, and in other embodiments includes biometric inputs including yet not limited to biometric input such as fingerprints or retinal scans.

The process of the invention in yet other embodiments includes the ability for a supervisor to set criteria for when email is sent by the apparatus of the invention and to whom email will be sent to. The criteria for when email is sent in such embodiments corresponds to one or more events that a supervisor has identified as important. Events include yet are not limited to when an individual's electrostatic discharge device fails a test, when an individual's electrostatic discharge device's resistance has changed, when an operator attempts to test a wrist strap when they should be testing both a wrist strap and a foot strap, or when other events occur. In some embodiments if the resistance of a particular electrostatic discharge device has changed over a period of time, such as when the resistance has increased over a period of days or weeks continuously, may be configured to be an event worthy of email notification to specific individuals or organizations. Events can thus be the detection of a trend, and they therefore can be used to initiate preventative action. A wrist strap that has reduced in resistance over a series of days in a trend: 3 Meg ohms, 2.75 Meg ohms, 2 Meg ohms, and 1 Meg ohms may be configured to trigger email to one or more individuals. The wrist strap may then be removed from service before it fails.

Someone with supervisor access privileges in some embodiments manipulates settings; settings are typically numbers, rates of change of numbers, or programmable test voltages. Resistance or impedance pass/fail settings may thus be changed on an embodiment of the apparatus of the invention using an embodiment of the process of the invention. Rates of change of resistance or impedance are other settings that may be configured on some embodiments of an apparatus of the invention using an embodiment of the process of the invention.

Although the disclosure herein refers to certain illustrated embodiments, it is to be understood that these embodiments have been presented by way of example rather than limitation. Corresponding or related structure and methods specifically contemplated, disclosed and claimed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the following claims and parts thereof, in any permutation and/or combination include the subject matter of any one or more of the following claims, in any permutation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

Figure 1:
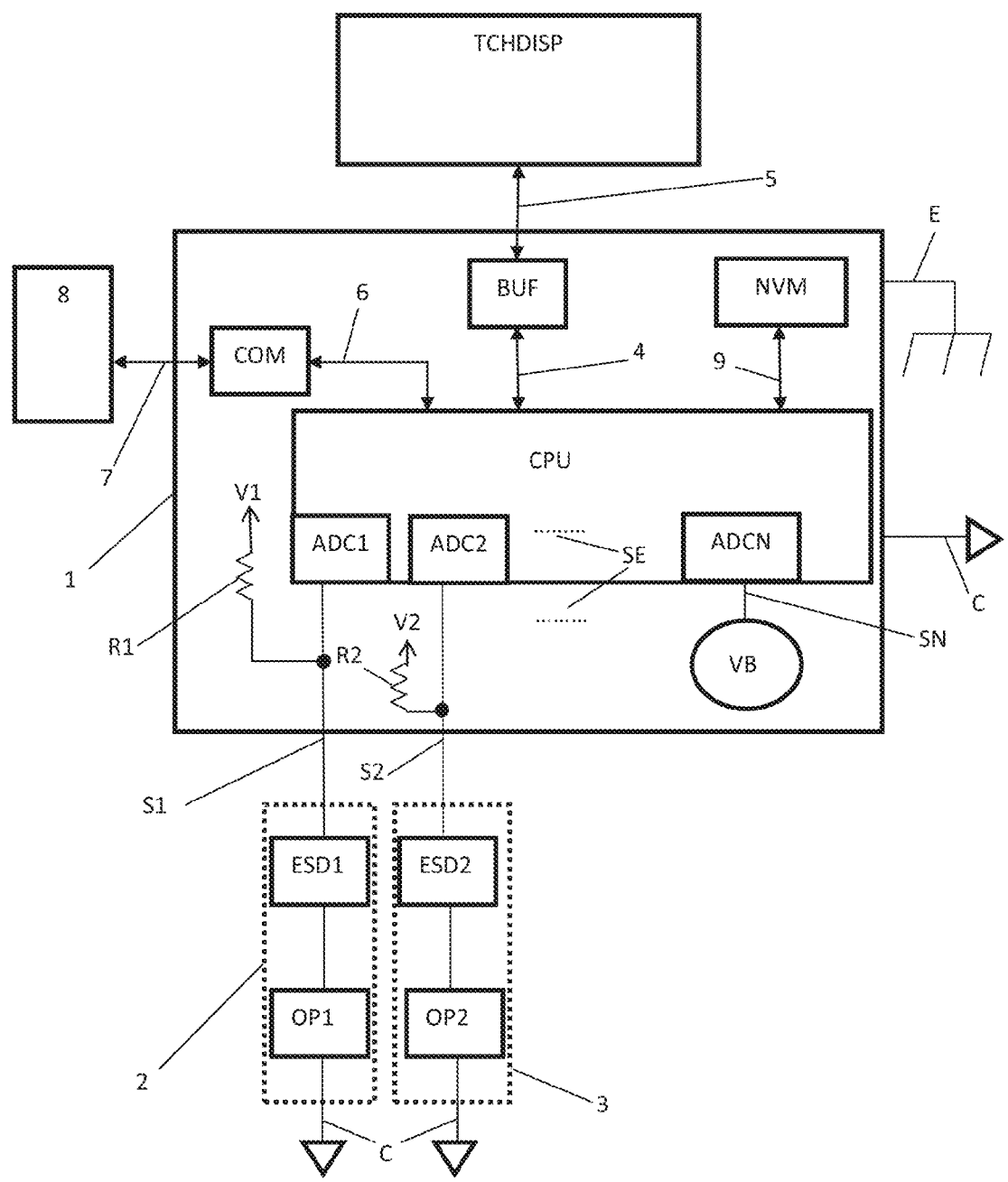
FIG. 1 is a simplified embodiment of the apparatus of the invention showing an operator connected to two different electrostatic discharge devices where the electro static discharge devices are connected to the apparatus of the invention.
Figure 2:
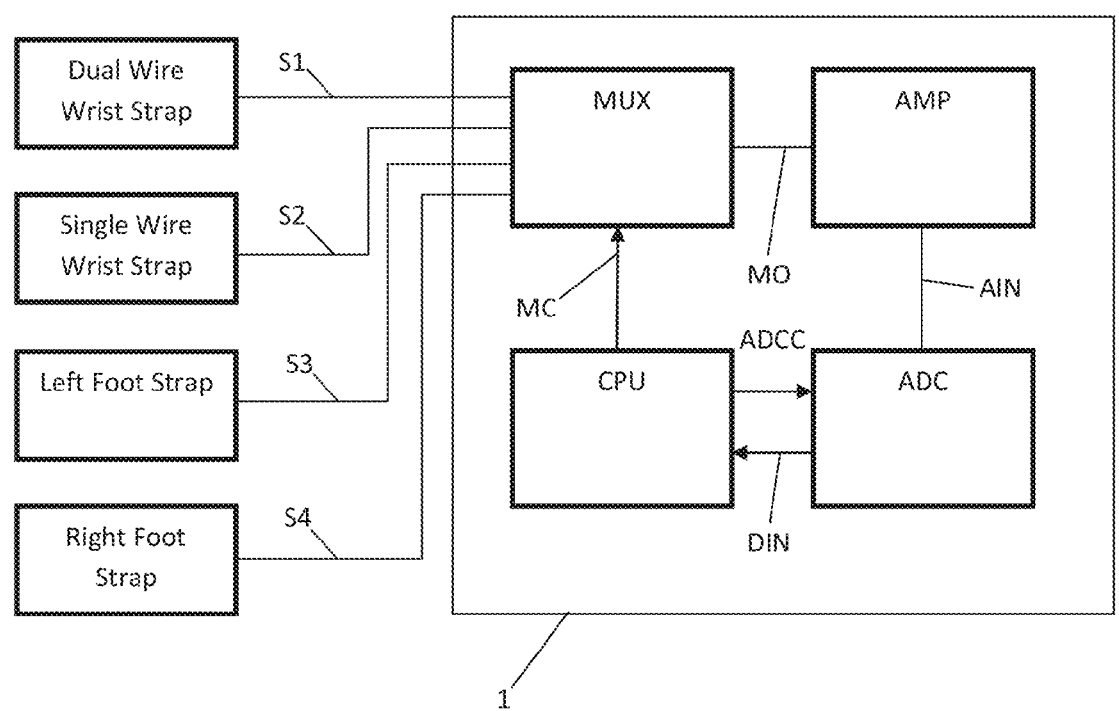
FIG. 2 shows a second simplified embodiment of the apparatus of the invention.
Figure 3:
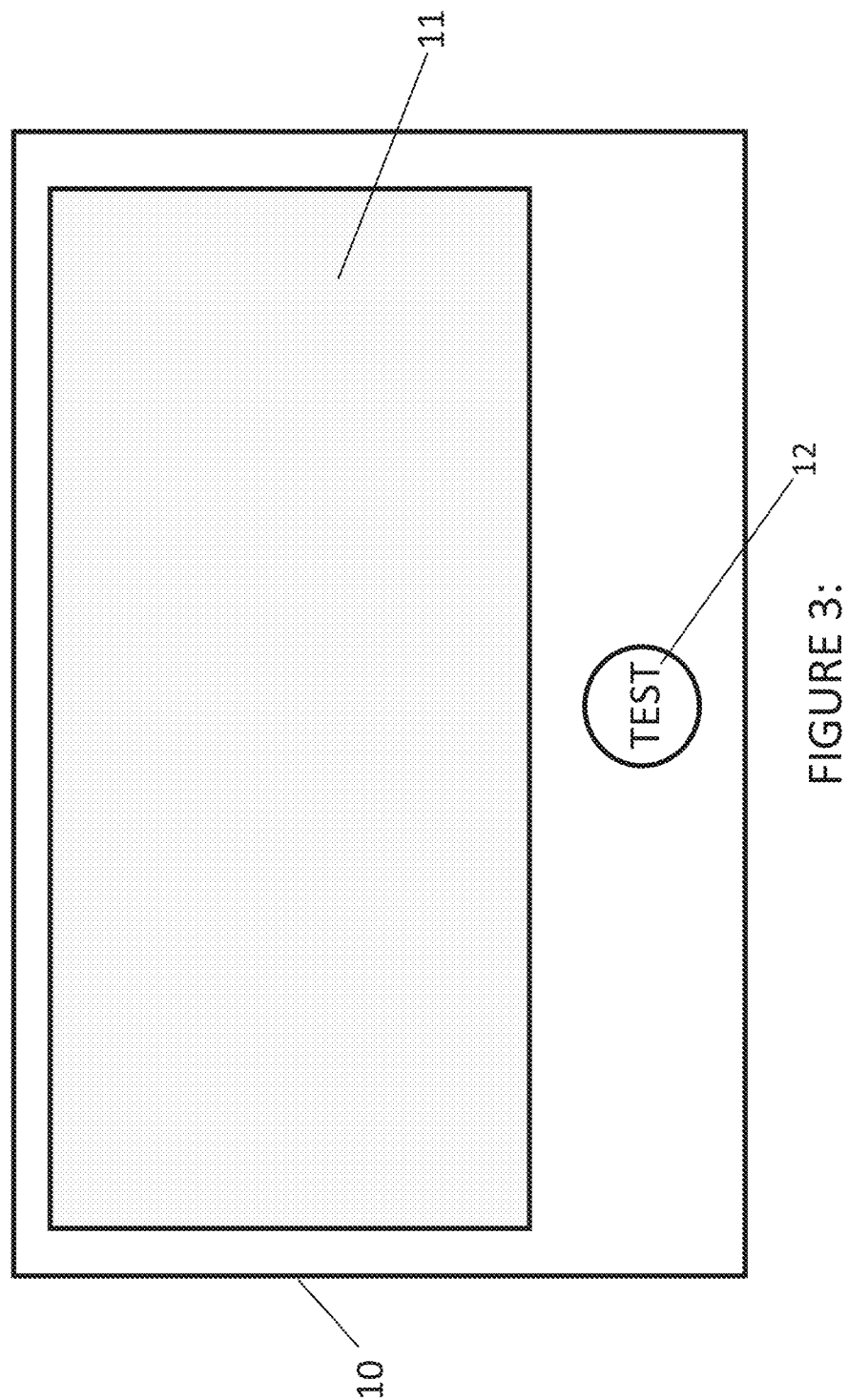
FIG. 3 is a simplified representation of the front of the apparatus of the invention.
Figure 4:
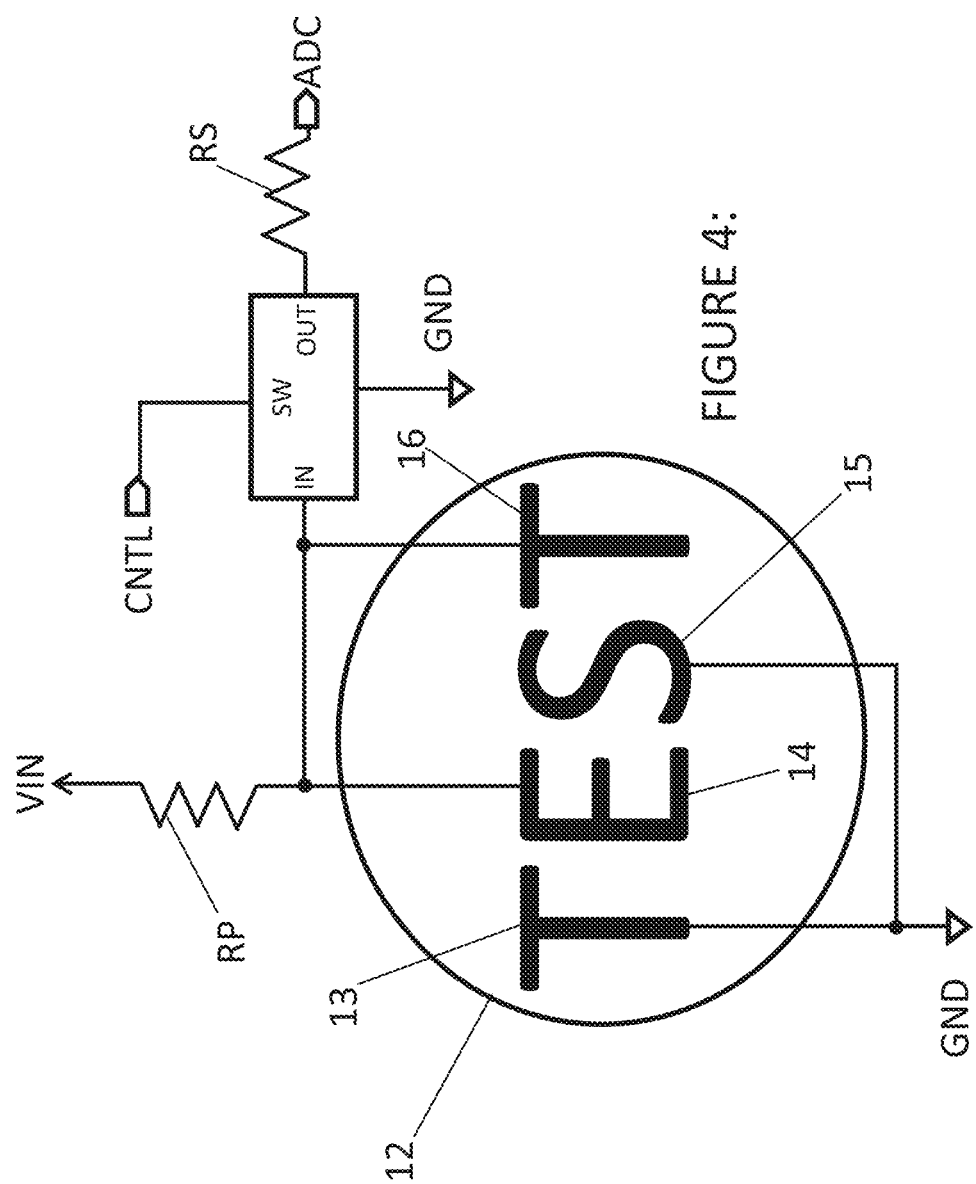
FIG. 4 shows a virtual test button used with an embodiment of the invention.
Figure 5:
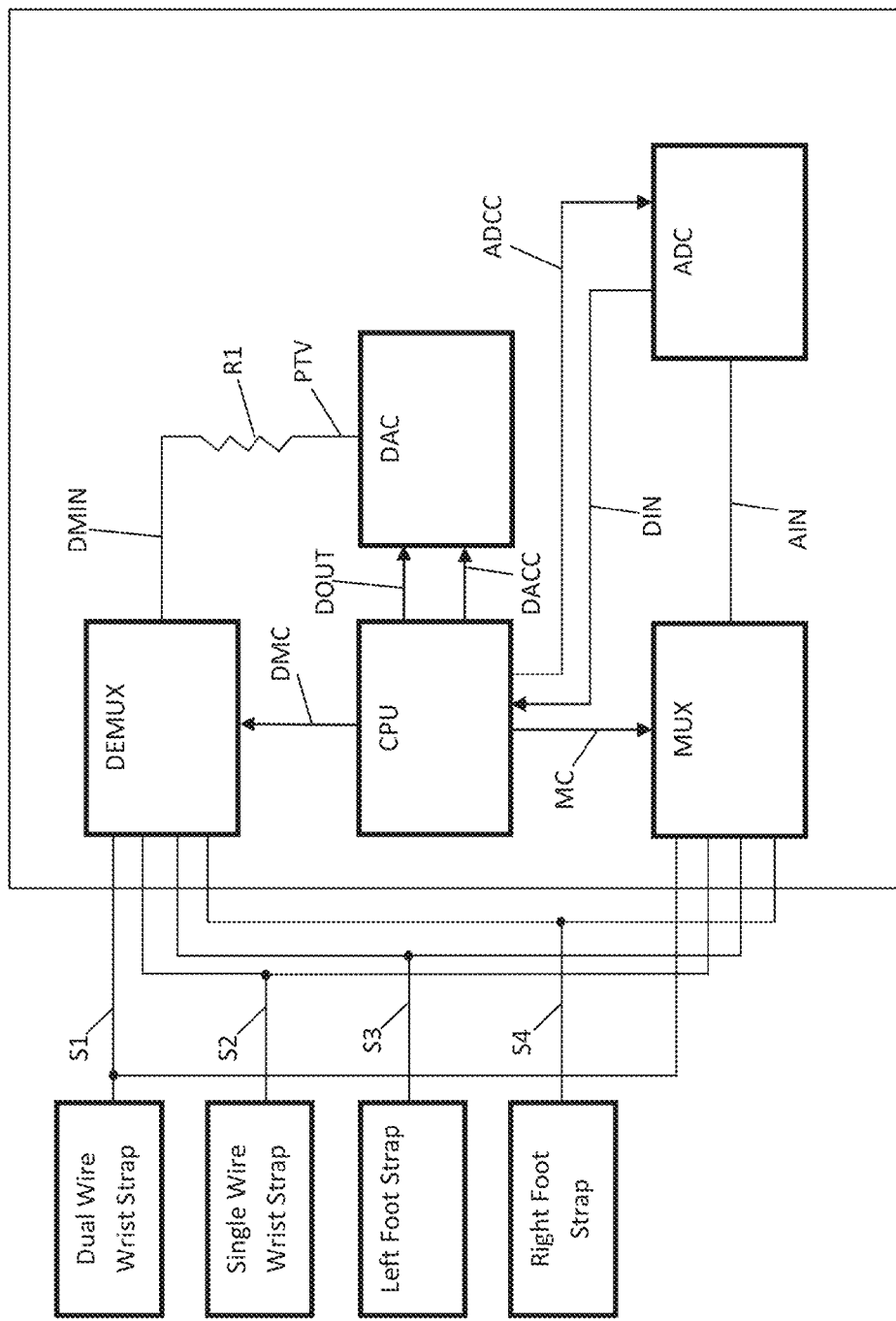
FIG. 5 shows a third simplified embodiment of the invention that incorporates a programmable test voltage into the invention.

The invention claimed is:

1. An apparatus for testing efficacy of an electrostatic discharge device, the apparatus comprising:
   a non-volatile memory that persistently stores test data, wherein the test data includes a measured impedance value of the electrostatic discharge device and a trend of measured impedance values of the electrostatic discharge device measured over time;
   a touch screen display that receives an impedance test limit for testing the electrostatic discharge device and a rate of change of impedance corresponding to the impedance of an electrostatic discharge device over time;
   a microcomputer that provides a digital value to a digital to analog converter;
   a digital to analog converter that outputs a voltage corresponding to the digital value;
   one or more analog to digital converters that receive an analog input and converts the analog input into a digital test value that is received by the microcomputer, wherein the microcomputer:
      converts the digital test value to a current measure of impedance of the electrostatic device,
      compares the current measure of impedance to the impedance test limit;
      compares the trend of measured impedance values of the electrostatic discharge device measured over time with the rate of change of impedance received over the touch screen display,
      identifies that a rate of change of impedance corresponds to an event, wherein the event causes the electrostatic discharge device to be removed from service, and
      outputs a test result for display on the touch screen display.

2. The apparatus of claim 1, wherein the test result displayed on the touch screen display corresponds to a specific type of electrostatic discharge device, and includes the test data from the testing of the electrostatic discharge device.

3. The apparatus of claim 2, further comprising a WEB portal that displays a WEB page on the touch screen display, wherein the WEB page includes the displayed information, the information displayed is organized and sorted based on one or more selections made by a user.

4. The apparatus of claim 2, wherein information displayed on the touch screen display corresponds to one or more metric selections, wherein the one or more metric selections includes at least one of a date, a time, a type of test, a type of electrostatic discharge display, and the information displayed on the touch screen display changes in response to changes made in the one or more selections.

5. The apparatus of claim 4, further comprising a data communication interface configured to send email to one or more individuals when the event is detected by the microcomputer.

6. The apparatus of claim 5, further comprising authentication of privileges of the user before allowing the user to configure the apparatus or to test the efficacy of the electrostatic discharge device.

7. The apparatus of claim 6 wherein the authentication includes a username and password.

8. The apparatus of claim 7 wherein the authentication includes a biometric input.

9. The apparatus of claim 4, further comprising a standard digital display interconnect for transmitting the display changes to an external display when an external display is connected to the standard display interconnect, wherein the current measure of impedance is displayed on the external display as a resistance value.

10. The apparatus of claim 4, further comprising:
a plurality of predominantly electrically conductive surfaces,
at least one virtual test button resistor,
at least one input voltage, and
at least one other electrical contact at a different voltage potential than the at least one input voltage, wherein:
at least one of the plurality of predominantly electrically conductive surfaces is electrically connected to a first end of the at least one resistor,
a second end of the at least one virtual test button resistor is connected to the input voltage,
at least one other of the plurality of predominantly electrically conductive surfaces is connected to the different voltage potential than the at least one input voltage, and
the at least one of the plurality of predominantly electrically conductive surfaces is adjacent to at least the one other of the plurality of predominantly electrically conductive surfaces, the at least one input voltage, the at least one virtual test button resistor, the at least of the plurality of predominantly electrically conductive surfaces, and the one other of plurality of predominantly electrically conductive surfaces configured to form a voltage divider network when touched by a person, wherein the apparatus tests the efficacy of the electrostatic device in response to the person touching the virtual test button.

11. The apparatus of claim 10, wherein the first end of the at least one virtual test button resistor is in electrical communication with at least one of the one or more analog to digital converters that is in communication with the microcomputer, wherein a change in the voltage detected on the first end of the at least one virtual test button resistor is interpreted by the microcomputer as a signal to test the electrostatic discharge device.

12. The apparatus of claim 4, wherein the digital to analog converter that outputs the voltage to one side of at least one test reference resistor, the second side of the at least one test reference resistor in electrical communication with the electrostatic discharge device, and the at least one analog to digital converter of the one or more analog to digital converters is also in electrical communication with the electrostatic discharge device.

13. A process for configuring an intelligent apparatus for testing the efficacy of electrostatic discharge devices, the process comprising:
receiving an impedance test limit and a rate of change of impedance corresponding to the impedance of an electrostatic discharge device over a touch screen display;
testing the electrostatic discharge device by measuring the impedance of the electrostatic discharge device, wherein the testing of the electrostatic discharge device includes:
a microcomputer that provides a digital value to a digital to analog converter;
the digital to analog converter outputting a voltage corresponding to the digital value;
an analog to digital converter receiving an analog input and converting the analog input into a digital test value that is received by the microcomputer, wherein the microcomputer converts the digital test value to a current measure of impedance of the electrostatic device,
storing the measured impedance of the electrostatic discharge device in memory;
identifying that the memory includes a plurality of impedance measurements of the electrostatic discharge device, wherein the plurality of impedance measurements of the electrostatic discharge device corresponds to a trend of measured impedance values of the electrostatic discharge device over time;
comparing the measured impedance of the electrostatic discharge device to the impedance test limit;
comparing the trend of measured impedance values with the rate of change of impedance;
identifying that the rate of change of impedance corresponds to an event, wherein the event causes the electrostatic discharge device to be removed from service, and
displaying a test result on the touch screen display.

14. The process of claim 13, wherein a supervisor sets configuration criteria for sending email to one or more individuals when the event occurs.

15. The process of claim 13, further comprising authenticating the access rights of a supervisor to configure the intelligent apparatus.

16. The process of claim 15, wherein the authenticating the access rights of the supervisor includes a login name and password.

17. The process of claim 15, wherein the authenticating of the access rights of the supervisor includes a biometric input.

18. The process of claim 13, further comprising testing the efficacy of one or more electrostatic discharge tests, wherein test results from the one or more electrostatic discharge tests are stored in a persistent non-volatile memory, and the current measure of impedance is a resistance.

19. The process of claim 13, wherein a supervisor configures the display of the test data from the plurality of electrostatic discharge tests on a computer in a remote location.

* * * * *